United States Patent
Kanamaru et al.

(10) Patent No.: US 7,028,273 B2
(45) Date of Patent: Apr. 11, 2006

(54) DELAY OPTIMIZATION DESIGNING SYSTEM AND DELAY OPTIMIZATION DESIGNING METHOD FOR A LOGIC CIRCUIT AND CONTROL PROGRAM

(75) Inventors: Keisuke Kanamaru, Tokyo (JP); Ko Yoshikawa, Tokyo (JP)

(73) Assignee: NEC Corporation, Tokyo (JP)

( * ) Notice: Subject to any disclaimer, the term of this patent is extended or adjusted under 35 U.S.C. 154(b) by 179 days.

(21) Appl. No.: 10/618,704

(22) Filed: Jul. 15, 2003

(65) Prior Publication Data
US 2004/0015789 A1 Jan. 22, 2004

(30) Foreign Application Priority Data
Jul. 17, 2002 (JP) .............................. 2002-207658

(51) Int. Cl.
*G06F 17/50* (2006.01)
(52) U.S. Cl. .................. 716/2; 716/4; 716/5; 716/6
(58) Field of Classification Search .............. 716/2, 716/4–6, 17; 326/93–98
See application file for complete search history.

(56) References Cited

U.S. PATENT DOCUMENTS

| | | | | |
|---|---|---|---|---|
| 6,185,720 B1 * | 2/2001 | Banik | .............................. | 716/2 |
| 6,536,030 B1 * | 3/2003 | Tanaka | ........................ | 716/17 |
| 6,817,001 B1 * | 11/2004 | Kudlugi et al. | ................ | 716/6 |
| 2003/0023941 A1 * | 1/2003 | Wang et al. | ................... | 716/4 |
| 2004/0046590 A1 * | 3/2004 | Singh et al. | .................. | 326/93 |

FOREIGN PATENT DOCUMENTS

| | | |
|---|---|---|
| JP | 6-290232 | 10/1994 |
| JP | 2000-305962 | 11/2000 |

* cited by examiner

*Primary Examiner*—Matthew Smith
*Assistant Examiner*—Naum B. Levin
(74) *Attorney, Agent, or Firm*—Young & Thompson (57) ABSTRACT

A delay optimization designing system and method is disclosed by which reduction of outputting delay and setup time of flip-flops and clock skew can be achieved and sufficient delay optimization can be achieved. A delay optimization designing system for a logic circuit includes a flip-flop selection section for selecting any flip-flop not to be substituted into a latch from within a given logic circuit, a flip-flop searching section for searching any flip-flop having a delay margin from among the flip-flops which are not selected by the flip-flop selection section, and a latch substitution section for substituting any flip-flop searched by the flip-flop searching section into a latch which passes a signal to the output side therethrough faster than the searched flip-flop.

15 Claims, 12 Drawing Sheets

DELAY OPTIMIZATION DESIGNING SYSTEM AND DELAY OPTIMIZATION DESIGNING METHOD FOR A LOGIC CIRCUIT AND CONTROL PROGRAM

BACKGROUND OF THE INVENTION

1. Field of the Invention

The present invention relates to a delay optimization designing system and a delay optimization designing method for a logic circuit and a control program, and more particularly to a delay optimization designing system and a delay optimization designing method for a sequential circuit and a control program.

2. Description of the Related Art

For delay optimization of a logic circuit, two methods are available including a delay optimization method for a sequential circuit which performs optimization regarding flip-flops and/or latches and another delay optimization method for a portion of a combinational circuit which exists between a flip-flop and a latch, between flip-flops and/or between latches. The present invention specifically relates to a method of delay optimization for a sequential circuit.

Conventionally, for delay optimization of a sequential circuit, a method called "retiming" is available and disclosed, for example, in Japanese Patent Laid-Open No. 290232/1994 (hereinafter referred to as document 1). This is a method for changing the position of a flip-flop to improve the worst delay.

Further, such a delay optimization method as described below is disclosed in Japanese Patent Laid-Open No. 2000-305962 (hereinafter referred to as document 2).

In this method, first, attention is paid to a specific flip-flop. Then, it is discriminated whether or not both of two conditions are satisfied including a first condition that the delay in a combinational circuit on the input side (preceding stage) of the flip-flop satisfies restrictions required in design with a predetermined margin and a second condition that the delay in a combinational circuit on the output side (succeeding stage) of the flip-flop does not satisfy restrictions required in design. Then, if both of the conditions are satisfied, then the flip-flop is substituted into a level-sensitive latch which immediately passes input data therethrough.

However, the method disclosed in the document 1 has such drawbacks as described below.

It is a first problem that, since the position of a flip-flop changes, operation of the flip-flop which makes a base of a logic analysis is different between an initial logic circuit and a logic circuit after optimization. Therefore, there is a drawback that, if a person who has designed the initial logic circuit tries to perform a logic analysis after optimization, then it is difficult for the person to take a suitable countermeasure.

It is a second drawback that, although the position of the flip-flop is changed, the delay of the overall logic circuit is not reduced.

On the other hand, in the method disclosed in the document 2, a flip-flop is substituted into a latch when, without depending upon whether or not the flip-flop has a delay margin, there is a delay margin on a combinational circuit in the preceding stage and there is no restriction violation of delay on a combinational circuit in the succeeding stage. Therefore, even if there is a flip-flop which itself has a delay margin thereon, the flip-flop is not substituted into a latch. As a result, sufficient delay optimization is not achieved.

SUMMARY OF THE INVENTION

It is an object of the present invention to provide a delay optimization designing system and a delay optimization designing method for a logic circuit and a control program by which reduction of the delay of an output and the setup time of a flip-flop and the clock skew can be achieved and all of flip-flops having a delay margin including a flip-flop to the input side of which a circuit having no delay margin is connected can be substituted into latches.

In order to attain the object described above, according to a first aspect of the present invention, there is provided a delay optimization designing system for a logic circuit including a plurality of flip-flops and a combinational circuit formed from logic circuit elements, comprising flip-flop selection means for selecting any flip-flop not to be substituted into a latch from within a given logic circuit, flip-flop searching means for searching any flip-flop having a delay margin from among the flip-flops which are not selected by the flip-flop selection means, and latch substitution means for substituting any flip-flop searched by the flip-flop searching means into a latch which passes a signal to the output side therethrough faster than the searched flip-flop.

According to another aspect of the present invention, there are provided a delay optimization designing method for a logic circuit including a plurality of flip-flops and a combinational circuit formed from logic circuit elements and a program for causing a computer to perform the delay optimization designing method, comprising a flip-flop selection step of selecting any flip-flop not to be substituted into a latch from within a given logic circuit, a flip-flop searching step of searching any flip-flop having a delay margin from among the flip-flops which are not selected at the flip-flop selection step, and a latch substitution step of substituting any flip-flop searched at the flip-flop searching step into a latch which passes a signal to the output side therethrough faster than the searched flip-flop.

With the delay optimization designing system and method and the program, reduction of outputting delay and setup time of flip-flops and clock skew can be achieved, and all of those flip-flops (including flip-flops wherein circuits on the input side do not have a delay margin) which have delay margins and to which non-latch substitution designation from the user is not given can be substituted into latches to achieve reduction of delay. Consequently, optimization of delay of the entire logic circuit can be sufficiently achieved.

The flip-flop may hold data inputted in response to an edge of a clock upon variation from a first level to a second level, and the latch substituted by the latch substitution means may pass input data when the clock indicates the first level therethrough to the output side.

Since the latch has a passing-through state, if a flip-flop is substituted into a latch, then although delay therein is cancelled, minimum delay compensation cannot be satisfied in the following stage.

In order to satisfy the minimum delay compensation, the delay optimization designing system further comprises latch insertion means for inserting a second latch, which passes input data at a timing different from that of the latch substituted by the latch substitution means, into a predetermined portion of the logic circuit.

The second latch inserted by the latch insertion means may pass input data when the clock indicates the second level therethrough to the output side. The second latch inserted by the latch insertion means may be arranged on the output side of the latch substituted by the latch substitution means.

Consequently, clock skew can be reduced and the delay margins existing in the flip-flops before latch substitution are absorbed in the latches by the latch substitution, and the delay margins are allocated to a circuit in the following stage to achieve moderation of delay restrictions. Furthermore, if latches which pass a signal at timing different from each other therethrough are inserted into suitable positions, then automatic substitution into a logic circuit which also satisfies minimum delay compensation can be achieved.

The above and other objects, features and advantages of the present invention will become apparent from the following description and the appended claims, taken in conjunction with the accompanying drawings in which like parts or elements are denoted by like reference symbols.

DESCRIPTION OF THE PREFERRED EMBODIMENT

Figure 2:
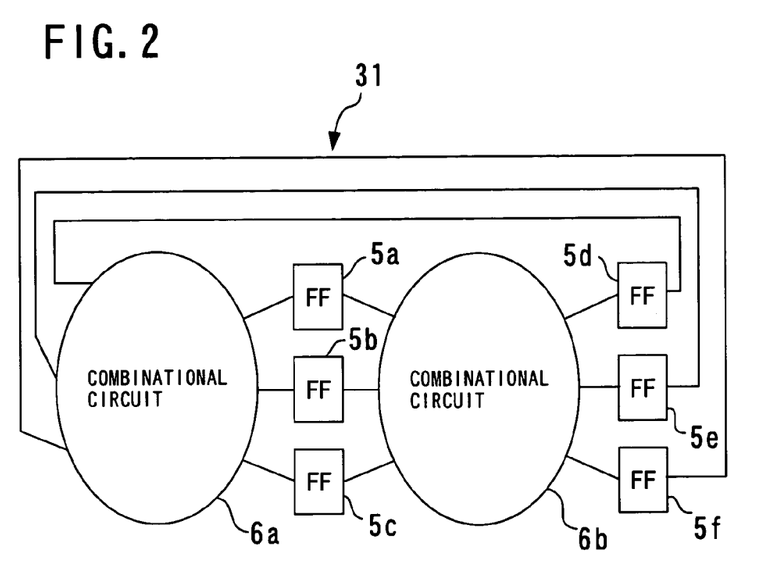
FIG. 2 is a diagrammatic view showing an example of a configuration of a logic circuit which is to make an object of optimization.
Figure 3:
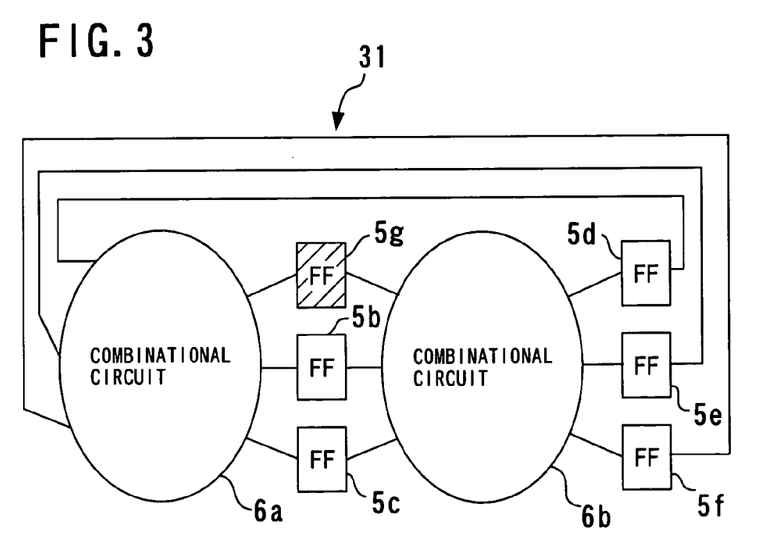
FIG. 3 is a diagrammatic view showing an example of a configuration of the logic circuit after non-latch substitution designation.
Figure 4:
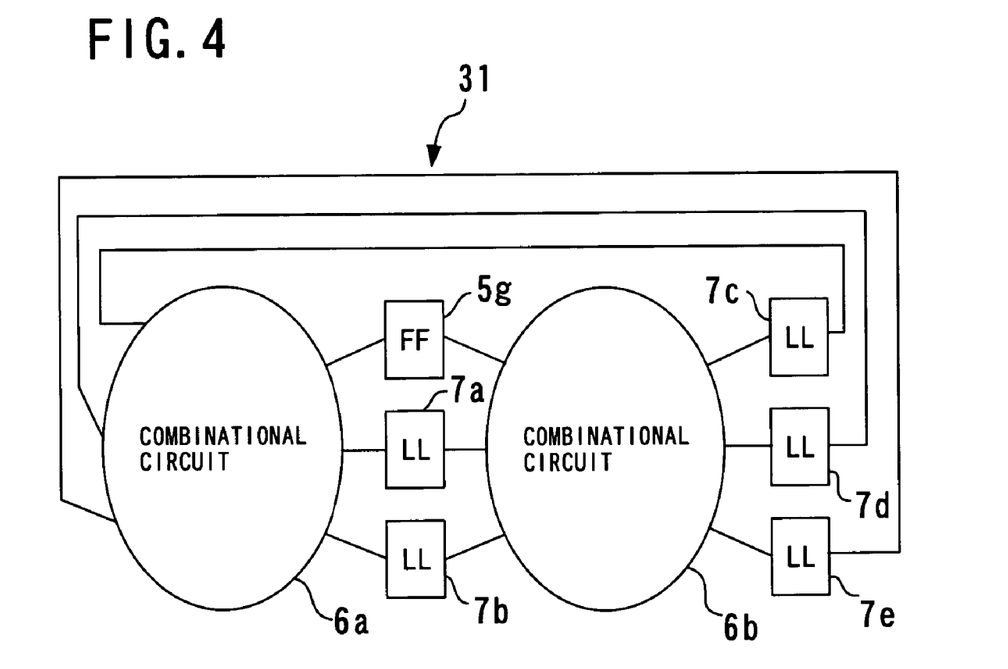
FIG. 4 is a diagrammatic view showing an example of a configuration of the logic circuit after latch substitution.
Figure 5:
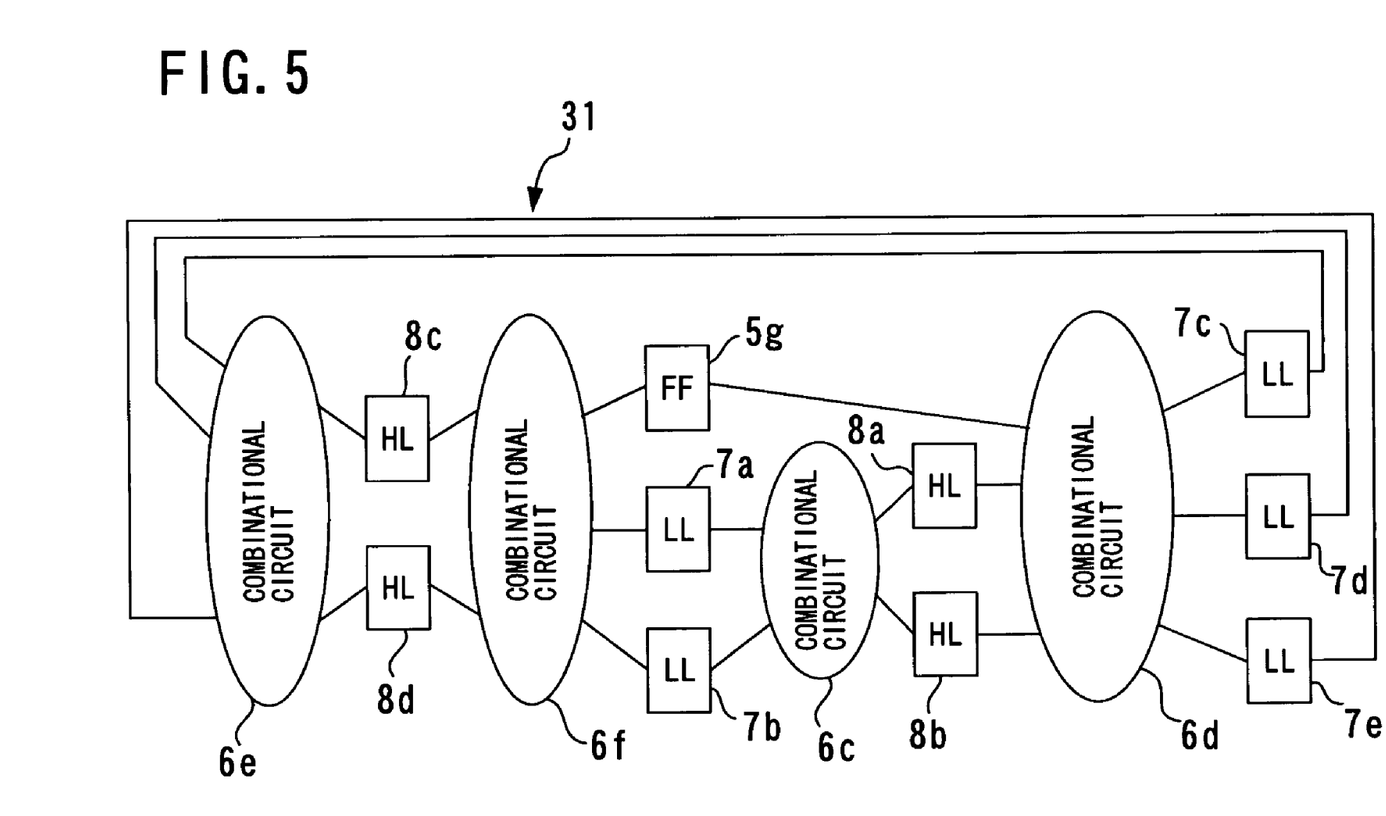
FIG. 5 is a diagrammatic view showing an example of a configuration of the logic circuit after a high-active latch (HL) is inserted.

Referring first to FIG. 2, there is shown an example of a logic circuit which is to make an object of optimization. The logic circuit shown is formed from a sequential circuit including flip-flops (FF) 5a to 5f and combinational circuits 6a and 6b formed from logic circuit devices. FIG. 3 illustrates a state of the sequential circuit after non-latch substitution designation is performed for the logic circuit just described, and particularly illustrates, as an example, a state after the non-latch substitution designation is performed for the flip-flop (FF) 5g. FIG. 4 illustrates a state of the sequential circuit after latch substitution, and particularly shows, as an example, a state after the flip-flops (FF) 5b to 5f are substituted into low-active latches (LL) 7a to 7e, respectively. FIG. 5 illustrates, as an example, a state after high-active latches (HL) 8a to 8d are inserted into the sequential circuit shown in FIG. 4.

Here, a flip-flop (FF), a low-active latch (LL) and a high-active latch (HL) are simply described. A flip-flop (FF) holds inputted data in response to an edge of a clock upon changing from the low level to the high level or holds inputted data in response to an edge of a clock upon changing from the high level to the low level.

On the other hand, a low-active latch and a high-active latch are used as latches. The low-active latch passes data inputted when the clock indicates the low level to the output side therethrough. Then, when the clock changes to the high level, the low-active latch latches the data, and thereafter, while the clock keeps the high level, the output data does not vary even if the input data varies. In contrast, the high-active latch passes data inputted when the clock indicates the high level to the output side therethrough. Then, when the clock changes to the low level, the low-active latch latches the data, and thereafter, while the clock keeps the low level, the output data does not vary even if the input data varies.

Figure 1:
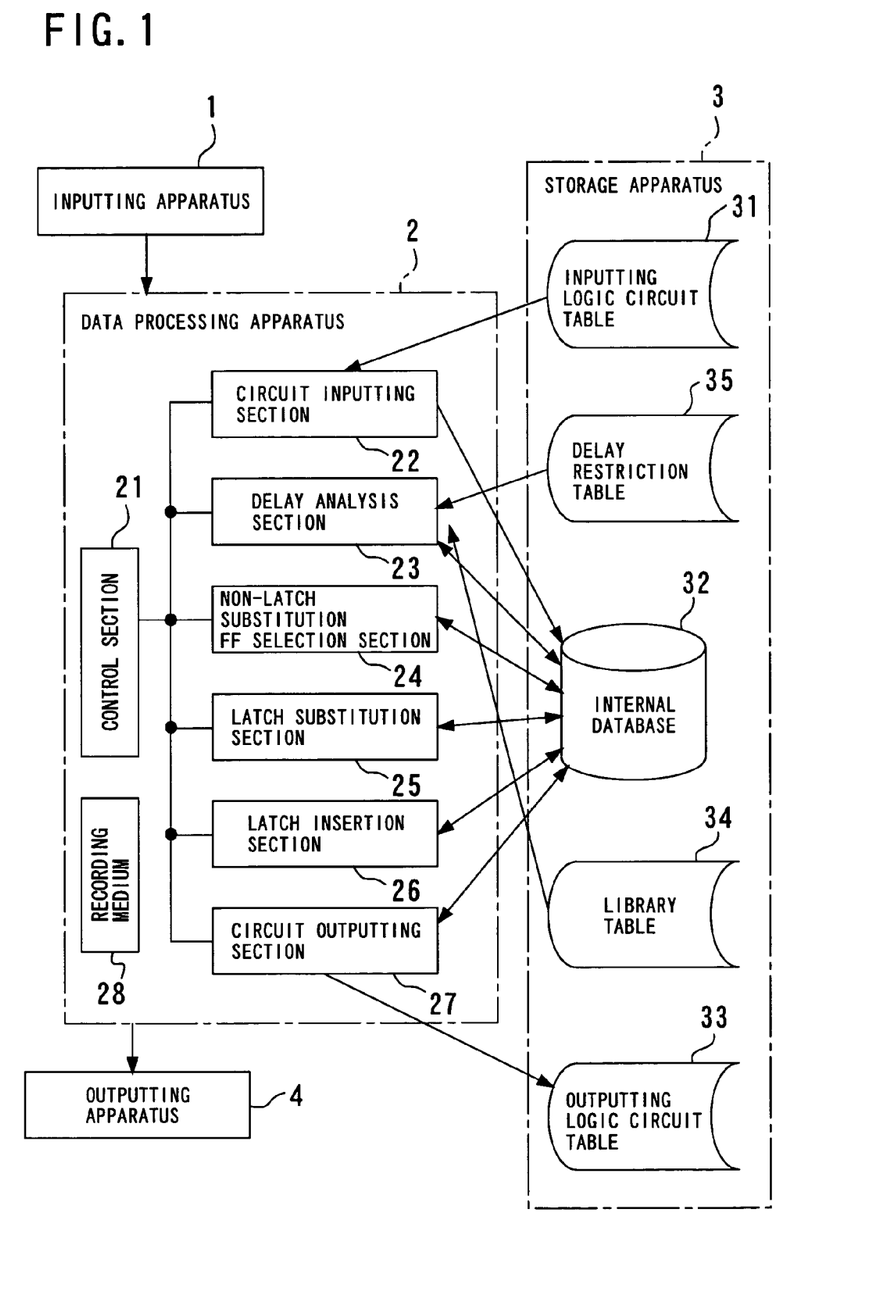
FIG. 1 is a schematic block diagram showing a configuration of a delay optimization designing system for a logic circuit to which the present invention is applied.

Referring now to FIG. 1, there is shown a configuration of a delay optimization designing system for a logic circuit to which the present invention is applied. The delay optimization designing system includes an inputting apparatus 1 such as a key board, a data processing apparatus 2 which operates under program control, a storage apparatus 3 for storing several kinds of information and an outputting apparatus 4 such as a display unit.

The storage apparatus 3 includes an input logic circuit table 31, an internal database (DB) 32, an output logic circuit table 33, a library table 34 and a delay restriction table 35.

While, as shown in FIG. 2, stored contents of the input logic circuit table 31 include the flip-flops (FF) 5a to 5f (where they need not be distinguished from each other, they are collectively referred to as flip-flops 5: this similarly applies also to other circuit elements) and the combinational circuits 6a and 6b (6) formed from the logic circuit elements, they include not only the components just described but also an interface for connecting to the outside of the logic circuit. However, since the interface is not referred to in the present embodiment, description thereof is omitted herein. It is to be noted that the combinational circuits 6a and 6b are formed as an aggregation which is formed from an AND circuit or circuits, an OR circuit or circuits, an inverter or inverters, a buffer or buffers and/or a logic circuit device or devices formed from a combination of them.

The internal database 32 is formed by processing information regarding the logic circuit so as to facilitate handling by the data processing apparatus 2, and can store information of the logic circuit devices in the logic circuit, connection information of them and delay calculation values hereinafter described.

The outputting logic circuit table 33 stores a logic circuit obtained finally by substitution.

The library table 34 stores delay information regarding logic circuit devices 9 appearing in FIG. 7 and so forth and hereinafter described, flip-flops (FF) 5, low-active latches 7 and high-active latches 8.

The delay restriction table 35 stores delay restriction for design. In particular, the delay restriction table 35 stores information of a clock (FIG. 8) of an object of design and a delay value of each portion of the logic circuit equivalent to an input interface for connecting to the outside represented as arrival time.

The data processing apparatus 2 includes a control section 21, a circuit inputting section 22, a delay analysis section 23, a non-latch substitution flip-flop (FF) selection section 24, a latch substitution section 25, a latch insertion section 26, a circuit outputting section 27 and a recording medium 28.

The control section 21 controls, in accordance with a program for a delay optimization process stored in the recording medium 28, the calling order among the circuit inputting section 22, delay analysis section 23, non-latch substitution FF selection section 24, latch substitution section 25, latch insertion section 26 and circuit outputting section 27.

The circuit inputting section 22 reads the inputting logic circuit table 31 to set the same into the internal database 32.

The delay analysis section 23 performs delay calculation for the logic circuit devices in the internal database 32.

The non-latch substitution FF selection section 24 searches for any flip-flop (FF), which is not to be substituted into a latch, designated from the inputting apparatus 1 from among all of the flip-flops (FF) in the logic circuit, and sets the resulting information as a non-latch substitution designation to the internal database 32. Here, it is assumed that the flip-flop (FF) 5g of FIG. 3 is designated so as not to be substituted into a latch.

The latch substitution section 25 searches, from within the internal database 32, the flip-flops 5b to 5f having a delay margin from among the flip-flops (FF) to which the non-latch substitution designation by the non-latch substitution FF selection section 24 is not applied and substitutes them into low-active latches (LL) 7a to 7e as shown in FIG. 4, respectively.

The latch insertion section 26 inserts latches (high-active latches HL) 8 which pass a signal therethrough at timing different from that of the latches (low-active latches LL) 7 substituted by the latch substitution section 25 into suitable positions in circuits on the output side (succeeding stage) of the latches (low-active latches LL) 7 substituted by the latch substitution section 25.

The circuit outputting section 27 outputs the internal database 32 after the final substitution as the output logic circuit table 33 to a storage apparatus.

Figure 7:
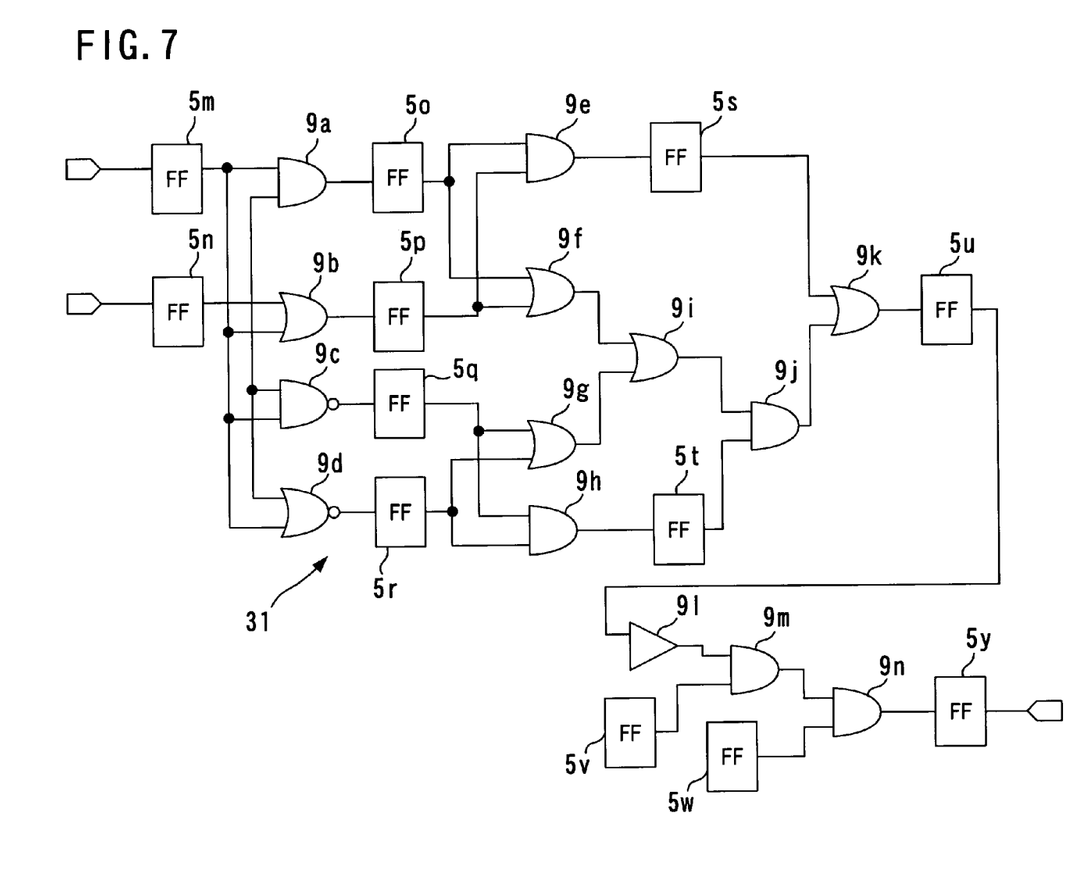
FIG. 7 is a circuit diagram showing a particular example of a logic circuit.
Figure 9:
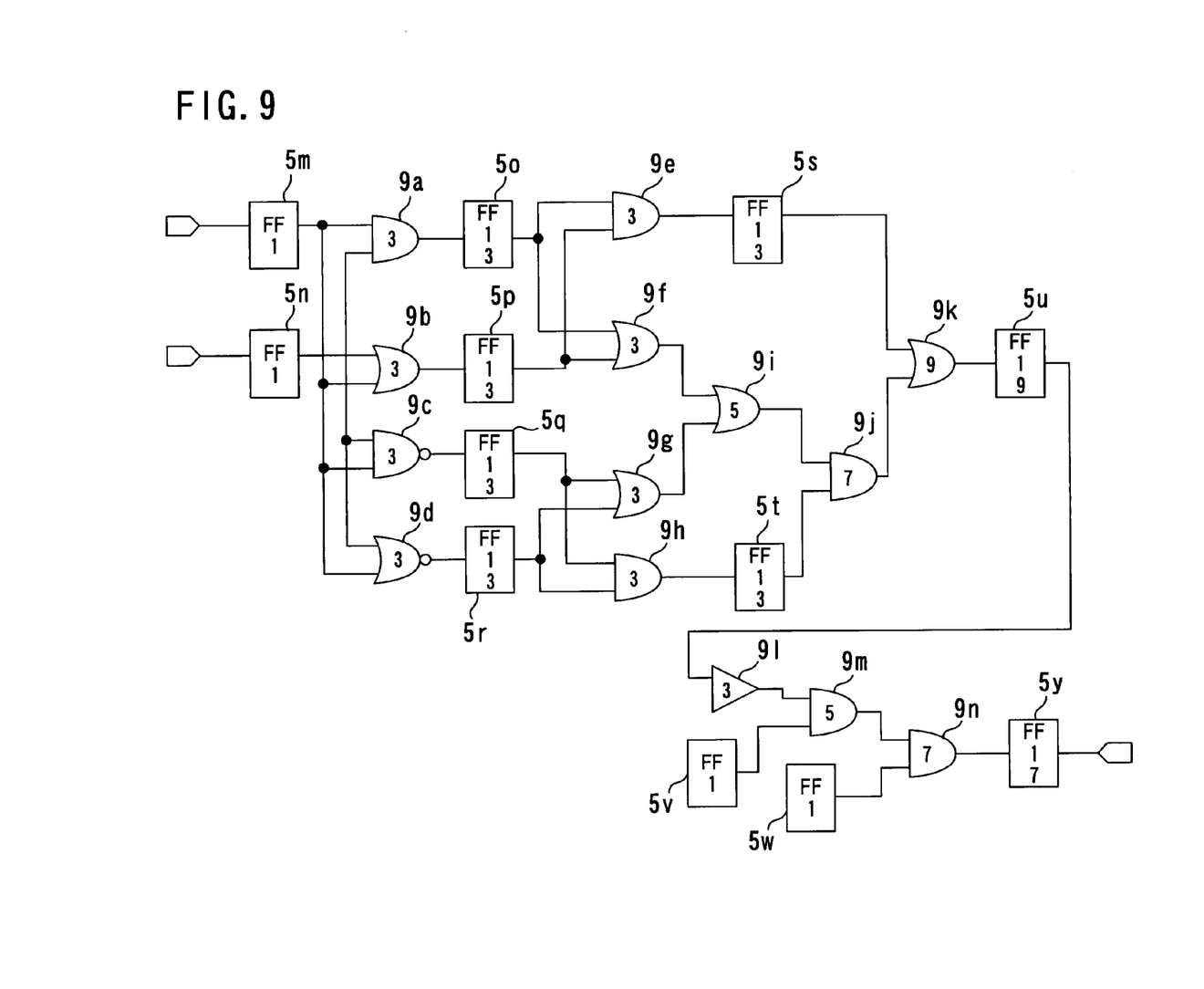
FIG. 9 is a circuit diagram showing the logic circuit of FIG. 7 to which signal arrival time at each of logic circuit devices is added.
Figure 10:
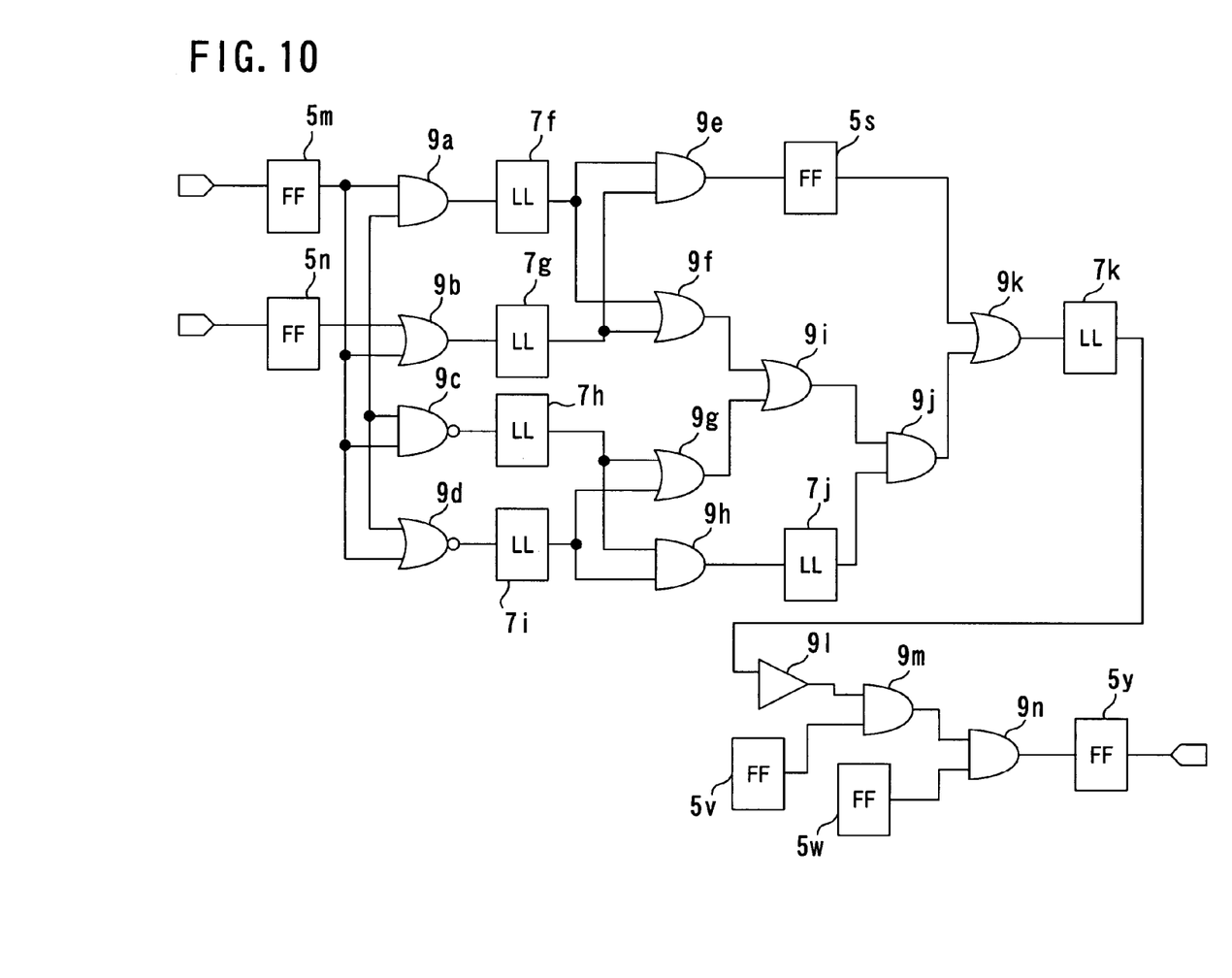
FIG. 10 is a circuit diagram showing a particular example of the logic circuit of FIG. 7 after latch substitution.
Figure 11:
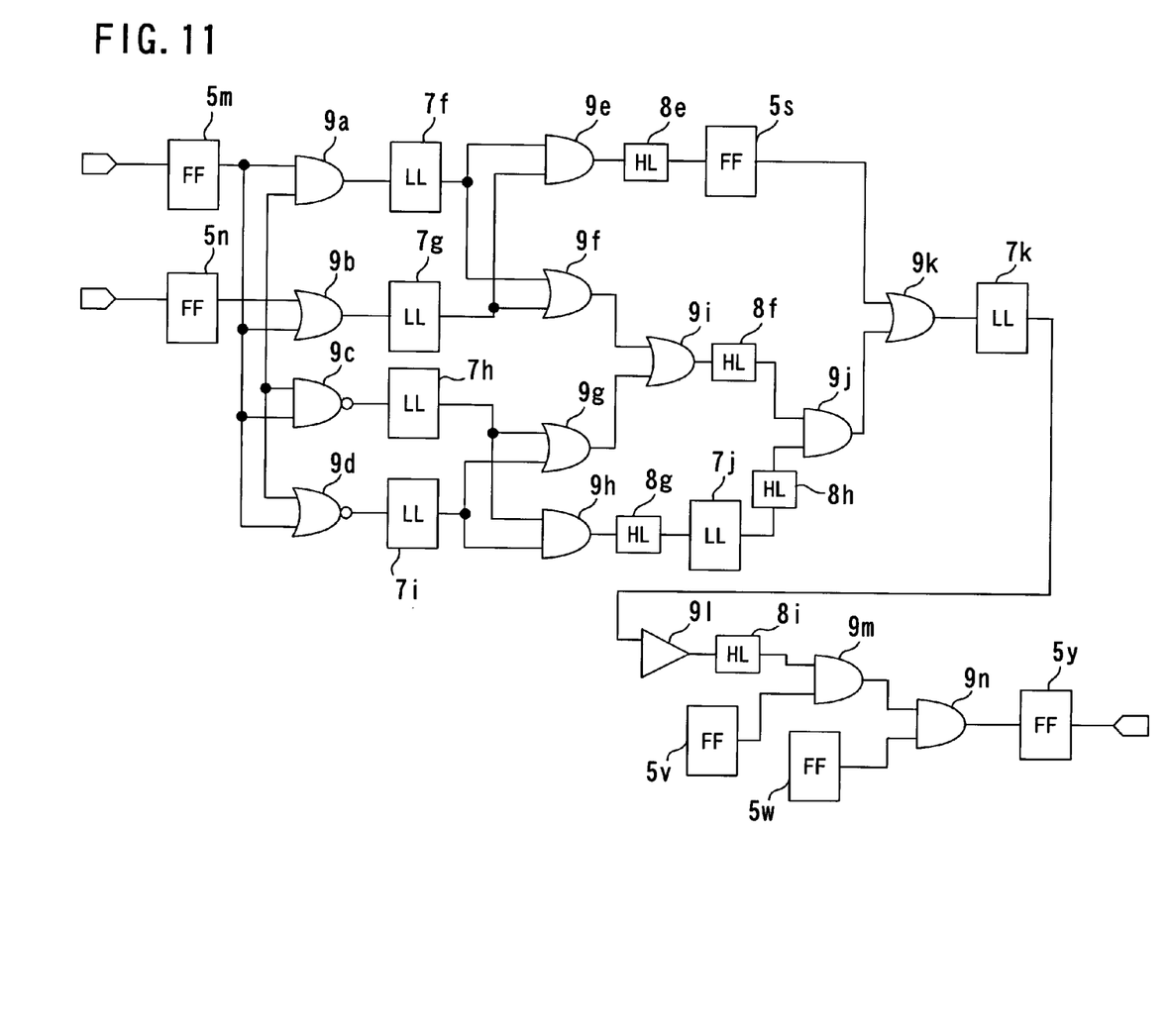
FIG. 11 is a circuit diagram showing a particular example of the logic circuit of FIG. 7 after a high-active latch (HL) is inserted.

FIG. 7 shows a particular example of a logic circuit. FIG. 9 shows the logic circuit of FIG. 7 in which signal arrival time at each of logic circuit devices is indicated. FIG. 10 shows a particular example of the logic circuit of FIG. 7 after latch substitution. FIG. 11 shows a particular example of the logic circuit of FIG. 7 after high-active latches (HL) are inserted.

Referring first to FIG. 7, the logic circuit shown includes flip-flops (FF) 5m to 5w and 5y, AND gates 9a, 9c, 9e, 9h, 9j, 9m, and 9n and OR gates 9b, 9d, 9f, 9g, 9i and 9k.

Referring now to FIG. 9, signal arrival time is indicated at each of the circuit devices of FIG. 7. Referring to FIG. 10, the flip-flops (FF) 5o to 5u of FIG. 7 are substituted into low-active latches (LL) 7f to 7k, respectively. Referring to FIG. 11, high-active latches (HL) 8e to 8i are further inserted into the logic circuit of FIG. 10.

Next, operation of the delay optimization designing system is described in detail with reference to FIGS. 1 to 6.

Figure 6:
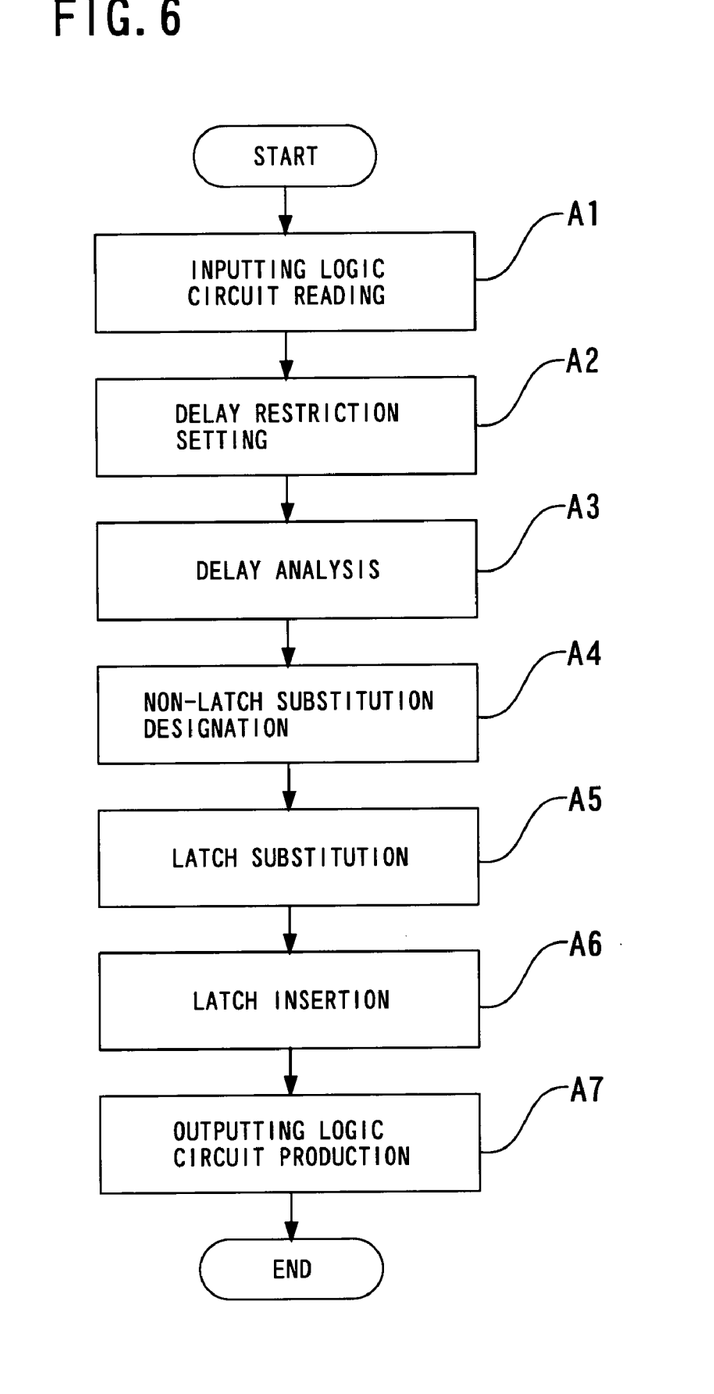
FIG. 6 is a flow chart illustrating an example of a delay optimization process for a logic circuit.

The stored contents of the input logic circuit table 31 designated by the inputting apparatus 1 are set to the internal database 32 by the circuit inputting section 22 (step A1 of FIG. 6). The logic circuit of FIG. 7 is taken as an example of a logic circuit defined by the input logic circuit table 31 to describe the operation below. Delay restrictions for design are stored in the delay restriction table 35. In particular, information (FIG. 8) of a clock of an object of design and delay values which are required from external flip-flops to inputting portions of the logic circuit are described as arrival time.

The delay analysis section 23 performs setting of the delay restrictions for delay calculation to the internal database 32 (step A2). In particular, a delay restriction is called arrival time of a signal. Then, for any input of any logic circuit which is to be an interface to the outside, a corresponding value is searched from within the delay restriction table 35 and is set into the internal database 32. Further, for an output of each flip-flop (FF) 5, an output delay value of the flip-flop is searched from within the library table 34 and is set into the internal database 32. Further, a target cycle of the clock is stored as T ns.

In the present embodiment, as an example, it is assumed that the output delay value and the setup time of a flip-flop (FF), the cycle of the clock, the clock skew and a passing-through delay of each latch are 1 ns, 1 ns, 8 ns, 1 ns and 1 ns, respectively. Accordingly, 1 ns is set as arrival time at an output of a flip-flop (FF).

The delay analysis section 23 calculates arrival time of all of the logic circuit devices 9 and sets a result of the calculation into the internal database (step A3). The arrival time of each of the logic circuit devices 9 is calculated from an external input of the logic circuit device and an output of a flip-flop (FF) 5 toward the outputting direction using an expression (1) described below.

$$\text{arrival time of logic circuit device} = \max(\text{arrival time values of logic circuit devices on input side} + \text{delay time from input PIN to output PIN}) \quad (1)$$

Here, while the delay time from the input PIN to the output PIN of each of devices which form the combinational circuit is calculated for each of the logic circuit devices using the library table 34, in the description of the present embodiment, it is assumed that the delay time is uniformly 2 ns.

FIG. 9 shows a result of the calculation just described. Numerical values entered in the logic circuit devices indicate individual arrival time values. Regarding each of the flip-flops (FF) 5, the numerical value on the upper side indicates arrival time at the output PIN of the flip-flop (FF) 5 and the numerical value on the lower side indicates arrival time from the input side. For example, regarding the flip-flop (FF) 5o, 1 ns which is a value stored in the library table 34 is set as arrival time on the output side.

For example, since the logic circuit device 9f has 2 ns as delay time of itself, arrival time of it is calculated as given below using the expression (1).

$$\text{arrival time} = \max(1+2, 1+2) = 3 \text{ ns} \quad (2)$$

Such a calculation process as just described is performed from the input side toward the output side of the logic circuit so that arrival time values of all of the logic circuit devices 9 and the flip-flops (FF) 5 are calculated.

The non-latch substitution FF selection section 24 sets a non-latch substitution flip-flop designated by the inputting apparatus 1. It is assumed now that the flip-flops (FF) 5m, 5n, 5s, 5v, 5w and 5y are designated as non-latch substitution flip-flops at step A4.

The latch substitution section 25 searches, from within the internal database 32, flip-flops (5o, 5p, 5q, 5t and 5u) having a delay margin from among the flip-flops (FF) to which the non-latch substitution designation by the non-latch substitution FF selection section 24 is not applied and substitutes them into low-active latches (7f, 7g, 7h, 7i, 7j and 7k) as shown in FIG. 10, respectively, (step A5).

Figure 8:
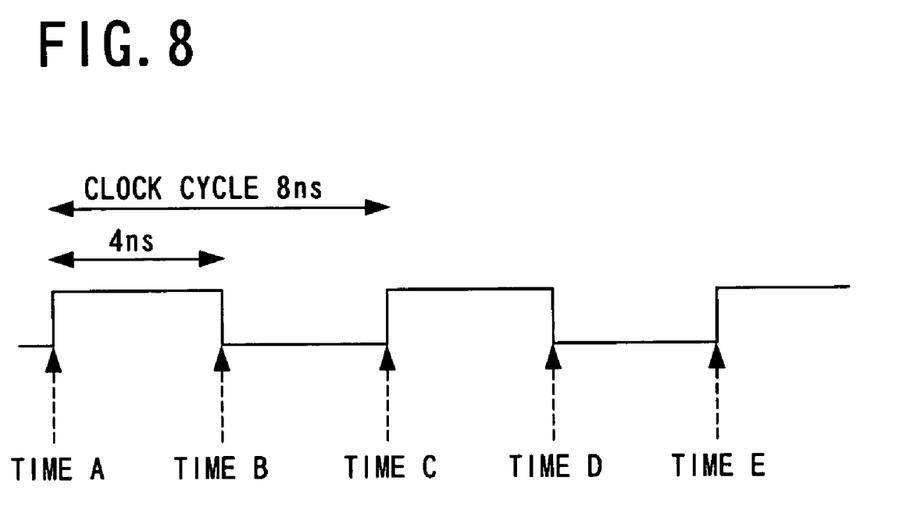
FIG. 8 is a diagram illustrating a corresponding relationship between clock cycles and times of the day.

For example, it is assumed that, in FIG. 9, signals to be outputted from the flip-flops (FF) 5m and 5n on the first stage start from the flip-flops (FF) 5m and 5n at time A of the day shown in FIG. 8. Since arrival time of the logic circuit device 9a on the second stage is 3 ns, the signal arrives at the flip-flop (FF) 5o on the third stage earlier than time B of the day (after 4 ns from the time A of the day). However, the flip-flop (FF) 5o propagates a variation of the signal on the input side to the output side thereof after time C of the day (after 8 ns from the time A of the day) at which a next rising edge of the clock appears. Accordingly, the flip-flop (FF) 5o has a delay margin equal to a time difference between the time B and C of the day.

Here, if the flip-flop (FF) 5o is substituted into the low-active latch (LL) 7f shown in FIG. 10 which passes a signal therethrough when the clock indicates the low level but holds the signal at a rising edge of the clock, then the signals starting at the time A of the day from the flip-flops (FF) 5m and 5n begin to propagate to the output side of the low-active latch (LL) 7f at the time B of the day. Accordingly, the signal can be propagated earlier by the time difference between the time B and C of the day.

The latch insertion section 26 refers to the internal database 32 to insert a latch (high-active latch HL) 8 which passes a signal at a timing different from that of the latches (low-active latches LL) 7 substituted formerly by the latch substitution section 25 into each suitable position in the logic circuit. As viewed at a signal arrival position in the logic circuit, the latches 8 are inserted into positions at which the delay time indicates a value proximate to the target cycle (8 ns) of the clock (step A6).

In particular, referring to FIG. 11, a high-active latch 8e is inserted between the AND gate 9e and the flip-flop (FF) 5s; a high-active latch 8g is inserted between the AND gate 9h and the low-active latch (LL) 7j; a high-active latch 8f is inserted between the OR gate 9i and the AND gate 9j; a high-active latch 8h is inserted between the low-active latch (LL) 7j and the AND gate 9j; and a high-active latch 8i is inserted between the inverter 91 and the AND gate 9m.

The reason why the high-active latches (HL) 8 are inserted is described below.

Referring to FIG. 10, a signal having passed through the low-active latch (LL) 7f arrives at the flip-flop (FF) 5s through the AND gate 9e. Here, in the logic circuit of FIG. 7, originally the signal outputted from the flip-flop (FF) 5o at the time C of the day should be received by the flip-flop (FF) 5s at time E of the day after the target cycle (8 ns) of the clock. However, there is the possibility that, since the flip-flop (FF) 5o and the substituted low-active latch (LL) 7f have passed the signal therethrough, the flip-flop (FF) 5s may receive the signal at the time C of the day.

In order to prevent this just described, that is, for minimum delay compensation, it is necessary to insert a high-active latch (HL) which passes the signal at a timing different from that of a low-active latch (LL) into a suitable position. Here, if the high-active latch (HL) 8e is inserted between the AND gate 9e and the flip-flop (FF) 5s, then the signal passes through the high-active latch (HL) 8e within a period from the time C of the day to time D of the day. Therefore, the flip-flop (FF) 5s in the next stage can receive the signal at the time E of the day.

After the latch insertion is performed as described above, the circuit outputting section 27 outputs the internal database 32 after the final substitution as the output logic circuit table 33 to the storage apparatus (step A7).

In the logic circuit in which a high-active latch (HL) is not inserted, the clock cycle is calculated as given below:

$$\text{clock cycle} = \text{maximum value of arrival time at flip-flop } (FF) + \text{setup time of flip-flop } (FF) + \text{clock skew} = 9 + 1 + 1 = 11 \text{ ns}$$

Referring to FIG. 9, it can be seen that the maximum value of the arrival time at the flip-flop (FF) is equal to 9 ns at the flip-flop (FF) 5u in the final stage.

Figure 12:
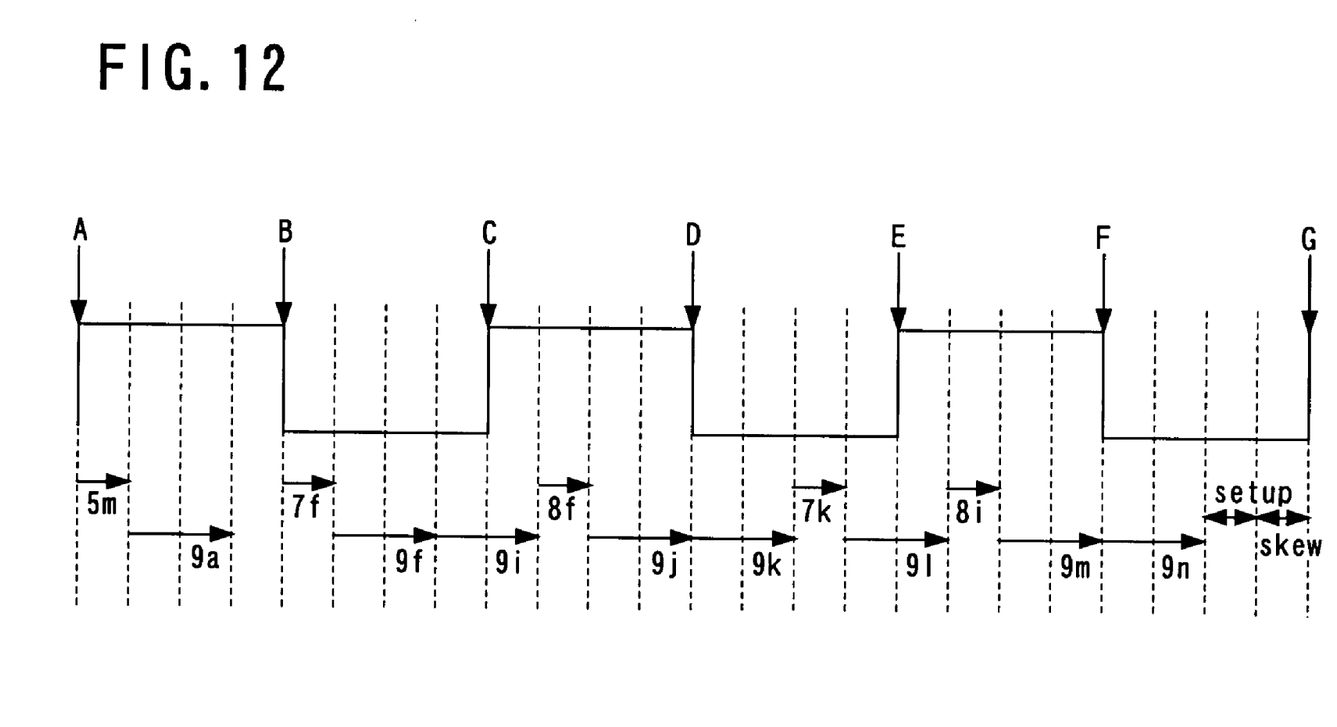
FIG. 12 is a timing chart illustrating signal transmission of a logic circuit to which the present invention is applied.

In contrast with the logic circuit of FIG. 9, the logic circuit of the example of FIG. 11 in which the high-active latches (HL) are inserted operates with the clock cycle of 8 ns shorter by 1 ns as seen in FIG. 12. FIG. 12 shows a timing chart of signal transmission where the high-active latches are inserted.

Referring to FIGS. 11 and 12, a signal inputted to the logic circuit at time A of the day of a rising edge of the clock passes the flip-flop (FF) 5m (delay value: 1 ns) and the AND gate 9a (delay value: 2 ns), and then passes the low-active latch (LL) 7f (delay value: 1 ns), OR gate 9f (delay value: 2 ns), OR gate 9i (delay value: 2 ns), high-active latch (HL) 8f (delay value: 1 ns) and AND gate 9j (delay value: 2 ns) at time B of the day at a falling edge of the clock. Then, the signal passes the OR gate 9k (delay value: 2 ns), low-active latch (LL) 7k (delay value: 1 ns), inverter 91 (delay value: 2 ns), high-active latch (HL) 8i (delay value: 1 ns) and AND gate 9m (delay value: 2 ns) at time D of the day at a next falling edge of the clock, and passes the AND gate 9n (delay value: 2 ns) at time F of the day at a further next falling edge of the clock. Further, if the setup time (1 ns) and time (1 ns) of the clock skew are added to the clock, then accurate time G of the day at a rising edge of the clock next to the last-mentioned falling edge is obtained.

Figure 13:
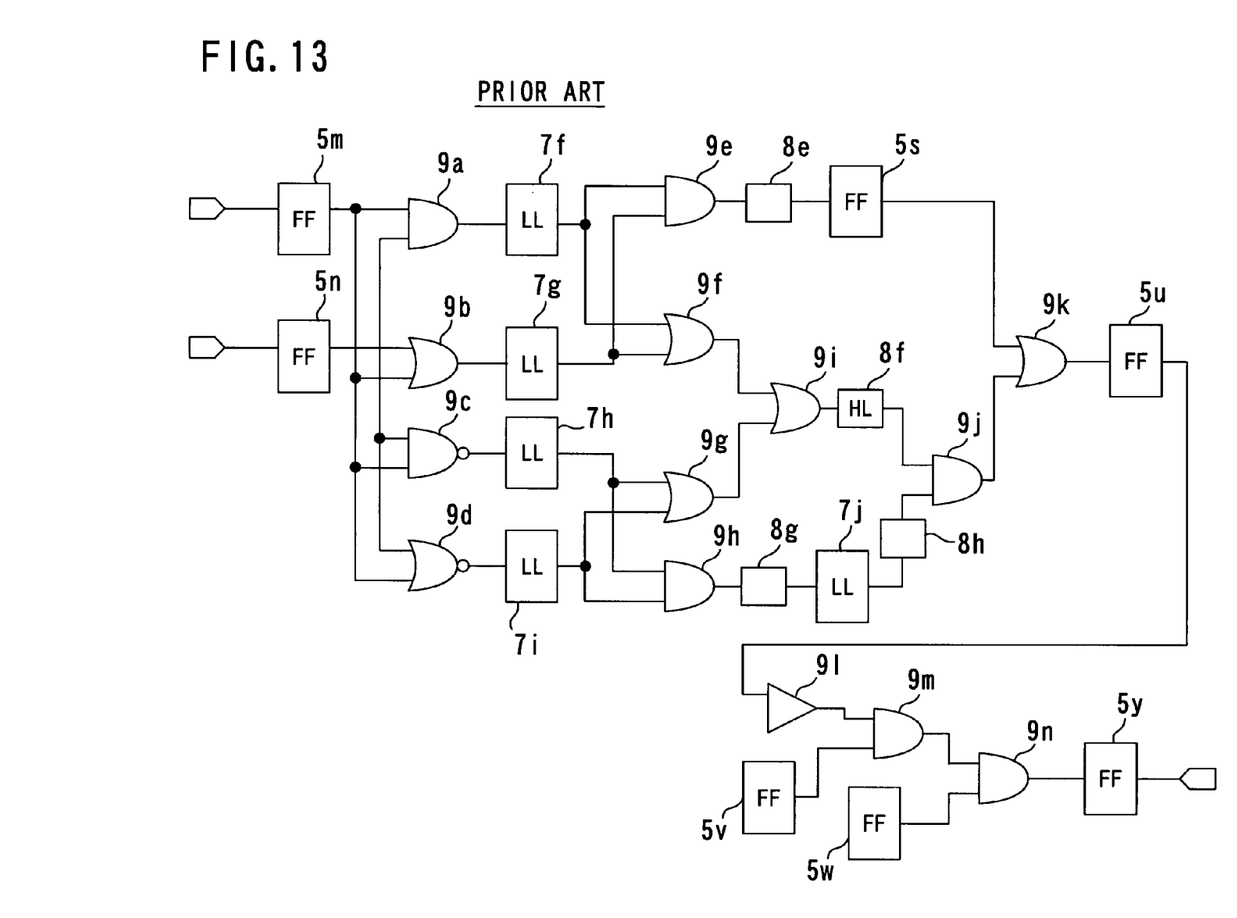
FIG. 13 is a circuit diagram showing a particular example of a logic circuit to which a conventional latch substitution technique is applied.

In the method disclosed in the document 2 (Japanese Patent Laid-Open No. 2000-305962), a flip-flop is substituted into a latch where, without depending upon whether or not the flip-flop itself has a delay margin, a combinational circuit in the preceding stage of the flip-flop has a delay margin and a combinational circuit in the succeeding stage does not have restriction violation of delay. Therefore, the circuit of FIG. 7 after the latch substitution varies into such a circuit as shown in FIG. 13. FIG. 13 is a circuit diagram showing an example of the logic circuit to which the conventional latch substitution method is applied.

Referring to FIG. 13, the flip-flop (FF) 5u where the combinational circuit on the input side does not have a delay margin is not substituted into a latch, and as a result, a path of the output side of the flip-flop (FF) 5u becomes a critical path. A clock cycle in the case just described is calculated as given below:

$$\text{clock cycle} = \text{delay of flip-flop } (FF) + \text{delay of combinational circuit} + \text{setup time of flip-flop} + \text{clock skew} = 1 + 6 + 1 + 1 = 9 \text{ ns}$$

As a result, the clock cycle of the circuit shown in FIG. 13 has a value higher than that (clock cycle=8 ns) of the circuit shown in FIG. 11.

While a preferred embodiment of the present invention has been described using specific terms, such description is for illustrative purposes only, and it is to be understood that changes and variations may be made without departing from the spirit or scope of the following claims.

What is claimed is:

1. A delay optimization designing system for a logic circuit including a plurality of flip-flops and a combinational circuit formed from logic circuit elements, comprising:
   a flip-flop selection means for selecting any flip-flop not to be substituted into a latch from within a given logic circuit;
   a flip-flop searching means for searching any flip-flop having a delay margin from among the flip-flops which are not selected by said flip-flop selection means; and
   a latch substitution means for substituting any flip-flop searched by said flip-flop searching means into a latch which passes a signal to the output side therethrough faster than the searched flip-flop.

2. A delay optimization designing system for a logic circuit as claimed in claim 1, wherein the flip-flop holds data inputted in response to an edge of a clock upon variation from a first level to a second level, and the latch substituted by said latch substitution means passes input data when the clock indicates the first level therethrough to the output side.

3. A delay optimization designing system for a logic circuit as claimed in claim 1, further comprising latch insertion means for inserting a second latch, which passes input data at a timing different from that of the latch substituted by said latch substitution means, into a predetermined portion of the logic circuit.

4. A delay optimization designing system for a logic circuit as claimed in claim 3, wherein the second latch inserted by said latch insertion means passes input data when the clock indicates the second level therethrough to the output side.

5. A delay optimization designing system for a logic circuit as claimed in claim 3, wherein the second latch inserted by said latch insertion means is arranged on the output side of the latch substituted by said latch substitution means.

6. A delay optimization designing method for a logic circuit including a plurality of flip-flops and a combinational circuit formed from logic circuit elements, comprising:
   a flip-flop selection step of selecting any flip-flop not to be substituted into a latch from within a given logic circuit;
   a flip-flop searching step of searching any flip-flop having a delay margin from among the flip-flops which are not selected at the flip-flop selection step; and
   a latch substitution step of substituting any flip-flop searched at the flip-flop searching step into a latch which passes a signal to the output side therethrough faster than the searched flip-flop.

7. A delay optimization designing method for a logic circuit as claimed in claim 6, wherein the flip-flop holds data inputted in response to an edge of a clock upon variation from a first level to a second level, and the latch substituted at the latch substitution step passes input data when the clock indicates the first level therethrough to the output side.

8. A delay optimization designing method for a logic circuit as claimed in claim 6, further comprising a latch insertion step of inserting a second latch, which passes input data at a timing different from that of the latch substituted at the latch substitution step, into a predetermined portion of the logic circuit.

9. A delay optimization designing method for a logic circuit as claimed in claim 8, wherein the second latch inserted at the latch insertion step passes input data when the clock indicates the second level therethrough to the output side.

10. A delay optimization designing method for a logic circuit as claimed in claim 8, wherein the second latch inserted at the latch insertion step is arranged on the output side of the latch substituted at the latch substitution step.

11. A program for causing a computer to perform a delay optimization designing method for a logic circuit including a plurality of flip-flops and a combinational circuit formed from logic circuit elements, comprising:
   a flip-flop selection step of selecting any flip-flop not to be substituted into a latch from within a given logic circuit;
   a flip-flop searching step of searching any flip-flop having a delay margin from among the flip-flops which are not selected at the flip-flop selection step; and
   a latch substitution step of substituting any flip-flop searched at the flip-flop searching step into a latch which passes a signal to the output side therethrough faster than the searched flip-flop.

12. A program as claimed in claim 11, wherein the flip-flop holds data inputted in response to an edge of a clock upon variation from a first level to a second level, and the latch substituted at the latch substitution step passes input data when the clock indicates the first level therethrough to the output side.

13. A program as claimed in claim 11, further comprising a latch insertion step of inserting a second latch, which passes input data at a timing different from that of the latch substituted at the latch substitution step, into a predetermined portion of the logic circuit.

14. A program as claimed in claim 13, wherein the second latch inserted at the latch insertion step passes input data when the clock indicates the second level therethrough to the output side.

15. A program as claimed in claim 13, wherein the second latch inserted at the latch insertion step is arranged on the output side of the latch substituted at the latch substitution step.

* * * * *